United States Patent
Yang et al.

(10) Patent No.: US 6,703,282 B1
(45) Date of Patent: Mar. 9, 2004

(54) METHOD OF REDUCING NMOS DEVICE CURRENT DEGRADATION VIA FORMATION OF AN HTO LAYER AS AN UNDERLYING COMPONENT OF A NITRIDE-OXIDE SIDEWALL SPACER

(75) Inventors: Fu Ji Yang, Fengshan (TW); Chun Lin Tsai, Hsin-chu (TW); Chien Chih Chou, Jubei (TW); Ting Jia Hu, Taichung (TW); Sheng Yuan Lin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/187,708

(22) Filed: Jul. 2, 2002

(51) Int. Cl.[7] .............................................. H01L 21/336
(52) U.S. Cl. ...................... 438/306; 438/299; 438/301; 438/303
(58) Field of Search ................... 438/299, 301, 438/303, 306

(56) References Cited

U.S. PATENT DOCUMENTS

| | | | |
|---|---|---|---|
| 5,702,986 A | 12/1997 | Mathews et al. | 438/163 |
| 5,723,352 A | 3/1998 | Shih et al. | 437/44 |
| 5,817,562 A | 10/1998 | Chang et al. | 438/305 |
| 5,915,178 A | 6/1999 | Chiang et al. | 438/266 |
| 6,001,690 A | 12/1999 | Chien et al. | 438/266 |
| 6,093,590 A | 7/2000 | Lou | 438/197 |
| 6,326,270 B1 * | 12/2001 | Lee et al. | 438/279 |
| 6,417,046 B1 * | 7/2002 | Ho et al. | 438/257 |
| 6,468,915 B1 * | 10/2002 | Liu | 438/706 |
| 6,479,349 B1 * | 11/2002 | Oya et al. | 438/261 |
| 6,518,636 B2 * | 2/2003 | Segawa et al. | 257/411 |
| 6,593,198 B2 * | 7/2003 | Segawa | 438/303 |
| 6,596,646 B2 * | 7/2003 | Andideh et al. | 438/723 |
| 2001/0052611 A1 * | 12/2001 | Kim | 257/296 |
| 2003/0017686 A1 * | 1/2003 | Wada | 438/586 |

* cited by examiner

Primary Examiner—Richard Elms
Assistant Examiner—Christian D. Wilson
(74) Attorney, Agent, or Firm—George O. Saile; Stephen B. Ackerman

(57) ABSTRACT

A method of forming an NMOS device with reduced device degradation, generated during a constant current stress, has been developed. The reduced device degradation is attributed to the use of a high temperature oxide (HTO), layer, used as an underlying component of composite insulator spacers, formed on the sides of the NMOS gate structures. After definition of an insulator capped polycide gate structure a thin, (140 to 160 Angstrom), HTO layer is deposited at a temperature between about 700 to 800° C., followed by the deposition of a silicon nitride layer. Definition of the composite insulator layer, comprised with the underlying, HTO, results in NMOS devices with reduced drain current and reduced transconductance values, when compared to counterparts fabricated with composite insulator spacers formed without the thin, HTO layer featured in this invention.

23 Claims, 3 Drawing Sheets

Device Current Degradation at 0.1V Vd as Function of Oxide Type & Thickness

| Buffer Oxide Type & Thickness | Max Id Degradation | Max Gm Degradation |
|---|---|---|
| None | 62% | 69% |
| HTO - 150 Angstroms | 9.5% | 11% |
| HTO - 100 Angstroms | 20% | 25% |
| RPO - 100 Angstroms | 34% | 40% |
| RPO - 150 Angstroms | 22% | 27% |

*FIG. 5*

METHOD OF REDUCING NMOS DEVICE CURRENT DEGRADATION VIA FORMATION OF AN HTO LAYER AS AN UNDERLYING COMPONENT OF A NITRIDE-OXIDE SIDEWALL SPACER

BACKGROUND OF THE INVENTION (1) Field of the Invention

The present invention relates to methods used to fabricate semiconductor devices, and more specifically to a method used to reduce device degradation of an N channel, metal oxide semiconductor (NMOS), device, via use of a composite insulator spacer located on the sides of a gate structure.

(2) Description of Prior Art

Static random access memory (SRAM), cells comprised with two P channel, metal oxide semiconductor (PMOS), transistors, and four NMOS transistors, are being used for logic applications. However it has been found that the yield of this type of SRAM cell is deleteriously influenced by device current degradation occurring for the NMOS components of the SRAM cell. After about five seconds of a constant current stress, applied to the NMOS device, degradation of 50 percent or greater has been observed for the NMOS drain current (Id), and transconductance (Gm), values. The degradation has been attributed to the use of a silicon nitride spacer, located on the sides of the gate structures of the NMOS devices. The stress of the silicon nitride spacer, of about 1000 Angstroms in thickness, located on the sides of a polycide gate structure, and located on the region of source/drain adjacent to the channel region, can induce the unwanted increases in the NMOS Id and Gm characteristics during normal device operation resulting in performance as well as yield loss.

This invention will teach a method of forming a sidewall spacer for gate structures of SRAM devices, in which the degradation in the Id and Gm characteristic of NMOS devices, during normal device operation, is reduced, when compared to counterparts fabricated with only thick silicon nitride sidewall spacers. Shih et al, in U.S. Pat. No. 5,723,352, use a silicon nitride—silicon oxide sidewall spacer to optimize performance and reliability of MOSFET devices, however that prior art features the use of a thermally grown, underlying silicon oxide layer which would not form on the sides of the dielectric layers used as capping layers for the gate structures, needed for the present invention.

SUMMARY OF THE INVENTION

It is an object of this invention to fabricate an NMOS device for a SRAM cell.

It is another object of this invention to reduce degradation of NMOS device drain current and transconductance, during device operation, via use of a composite insulator spacer formed on the sides of a polycide gate structure.

It is yet another object of this invention to use a high temperature oxide (HTO), layer, as an underlying component of a silicon nitride—silicon oxide composite insulator spacer, on the sides of an NMOS gate structure.

In accordance with the present invention a method of forming a composite insulator spacer, on the sides of gate structures, located in an SRAM cell, featuring an HTO oxide layer as the underlying component of a silicon nitride—silicon oxide composite insulator spacer, is described. After formation of insulator capped, polycide gate structures on an underlying gate insulator layer, lightly doped source/drain regions are formed for both NMOS and PMOS devices, of the SRAM cell. A high temperature oxide (HTO), layer is next deposited, at a thickness between about 140 to 160 Angstroms, followed by the deposition of a silicon nitride layer. An anisotropic reactive ion etch (REE), procedure is then employed to define a composite insulator spacer, comprised of an overlying silicon nitride layer on the underlying HTO layer, on the sides of the NMOS and PMOS gate structures. Heavily doped source/drain regions are then formed for both NMOS and PMOS devices, with subsequent degradation of drain current and transconductance for the NMOS device reduced as a result of the use of the thin HTO component of the composite insulator sidewall spacer.

BRIEF DESCRIPTION OF THE DRAWINGS

The object and other advantages of this invention are best described in the preferred embodiments with reference to the attached drawings that include:

FIG. 5 which in tabular form shows drain current, and transconductance degradation of NMOS devices, as a function of the type, and thickness of an silicon oxide layer, used as an underlying component of a silicon nitride—silicon oxide, composite insulator spacer, located on the sides of an insulator capped, NMOS gate structure.

DESCRIPTION OF THE PREFERRED EMBODIMENTS

Figure 1:
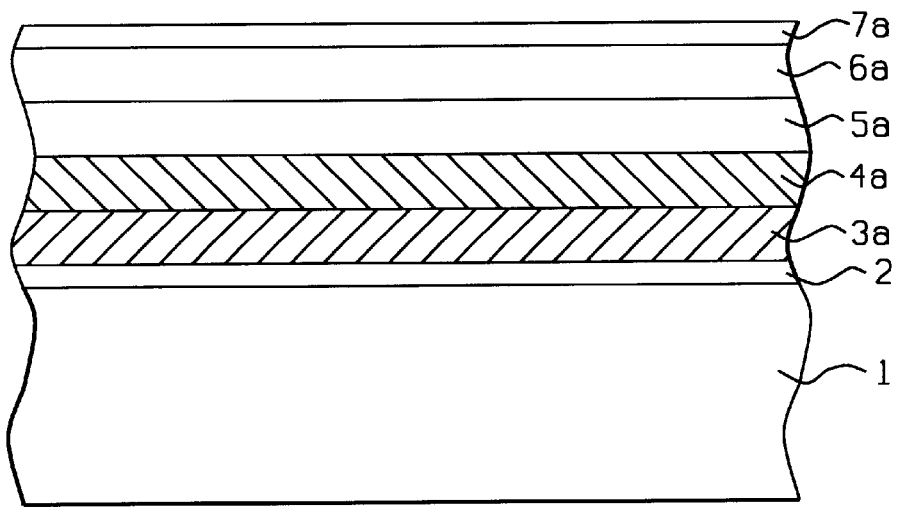
FIGS. 1–4, which schematically, in cross-sectional style, describe key stages of fabrication of an NMOS device, featuring an HTO layer as an underlying component of a silicon nitride—silicon oxide composite insulator layer, located on the sides of an insulator capped gate structure.

The method of forming a composite insulator spacer, on the sides of an NMOS gate structure, featuring a high temperature oxide (HTO), layer, used as an underlying component of the composite insulator spacer, allowing reduction in drain current and transconductance degradation, generated during device operation, to be realized, will now be described in detail. The novel composite insulator spacer, featuring the HTO layer, will be described as applied to the NMOS devices of the SRAM cell. However this composite insulator spacer, described in this invention, is also simultaneously formed on the sides of the gate structures of the PMOS devices in the SRAM cell. A P type, semiconductor substrate 1, comprised of single crystalline silicon, with a <100> crystallographic orientation, is used and schematically shown in FIG. 1. A gate insulator layer 2, comprised of silicon dioxide, is next formed at a thickness between about 50 to 100 Angstroms, via thermal oxidation procedures performed at a temperature between about 900 to 1100° C., in an oxygen—steam ambient. Deposition of polysilicon layer 3a, is next addressed via low pressure chemical vapor deposition (LPCVD), procedures, to a thickness between about 1000 to 1200 Angstroms. Polysilicon layer 3a, shown schematically in FIG. 1, can be doped in situ during deposition, via the addition of arsine or phosphine to a silane ambient, or polysilicon layer 3a, can be deposited intrinsically then doped via implantation of phosphorous or arsenic ions. Tungsten silicide layer 4a, is next deposited via LPCVD procedures, at a thickness between about 900 to 1100 Angstroms, using silane and tungsten hexafluoride as reactants, followed by the deposition of HMOX layer 5a, a silicon oxide layer, at a thickness between about 900 to 1100 Angstroms, via plasma enhanced chemical vapor deposition (PECVD), procedures. Silicon nitride layer 6a, is then deposited overlying HMOX layer 5a, via PECVD or LPCVD procedures, at a thickness between about 750 to 850 Angstroms. Finally an anneal procedure, performed in an oxygen ambient, at a temperature between about 800 to 1000° C., is used to lower the resistance of tungsten silicide layer 4a, resulting in the formation of silicon oxynitride layer 7a, at a thickness between about 60 to 80 Angstroms, the result of these depositions and anneal procedures, is schematically shown in FIG. 1.

Figure 2:
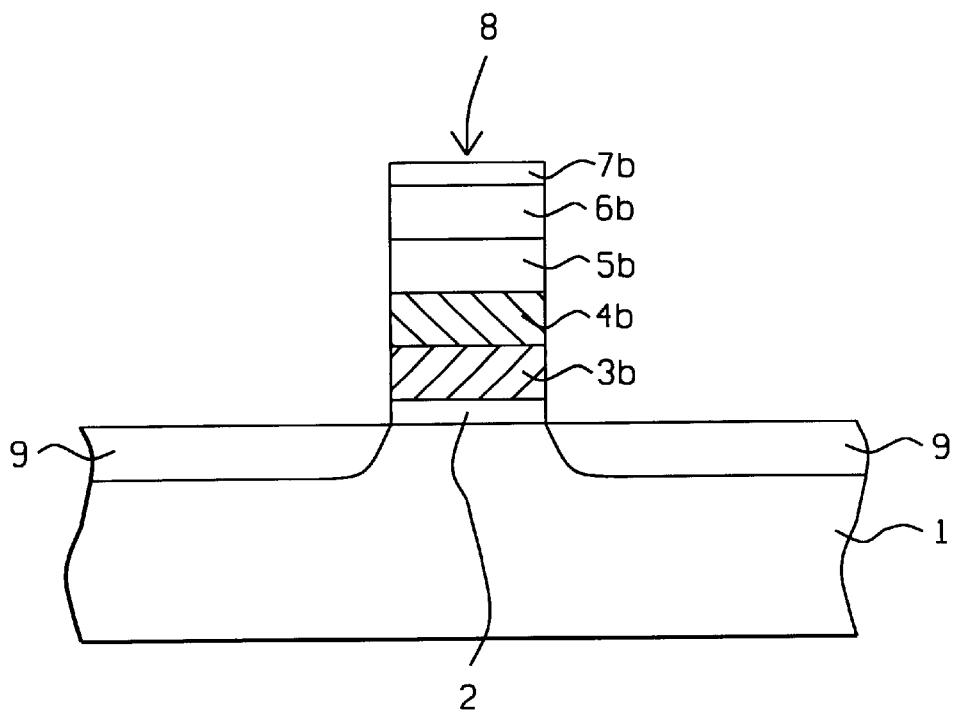

The formation of insulator capped, polycide gate structure 8, is next addressed and schematically shown in FIG. 2. A photoresist shape, not shown in the drawings, is used as an etch mask to allow definition of insulator capped, polycide gate structure 8, to be accomplished via an anisotropic RIE procedure using $CHF_3$ or $CF_4$ as an etchant for silicon oxynitride layer 7a, for silicon nitride layer 6a, and for HMOX layer 5a, while $SF_6$ or $Cl_2$ is used as an etchant for tungsten silicide layer 4a, and for polysilicon layer 3a. Insulator capped, polycide gate structure 8, with a width between about 0.20 to 0.30 um, is comprised of silicon oxynitride component 7b, silicon nitride component 6b, HMOX component 5b, tungsten silicide component 4b, and polysilicon component 3b. The photoresist shape used as a mask for definition of insulator capped, gate structure 8, is removed via plasma oxygen ashing and careful wet clean procedures, with a buffered hydrofluoric acid procedure, used as a component of the wet clean procedure, removing the portions of gate insulator layer 2, not covered by insulator capped, gate structure 8. N type, lightly doped source/drain (LDD), region 9, shown schematically in FIG. 2, is next formed in an area of semiconductor substrate 1, not covered by insulator capped, gate structure 8, via implantation of arsenic or phosphorous ions, at an energy between about 20 to 50 KeV, at a dose between about 1E15 to 6E15 atoms/cm$^2$.

It should be noted that this invention is described as applied to gate structures of NMOS, in an SRAM cell. Therefore to form the N type, LDD and subsequent heavily doped source/drain regions, areas of semiconductor substrate 1, designed for PMOS devices will be blocked during the formation of the N type source/drain regions, while similar blocking of the NMOS devices will be used during processing of the P type source/drain regions for the SRAM, PMOS devices. However these block out procedures will not be included, or described, in the preferred embodiment or in the drawings.

Figure 3:
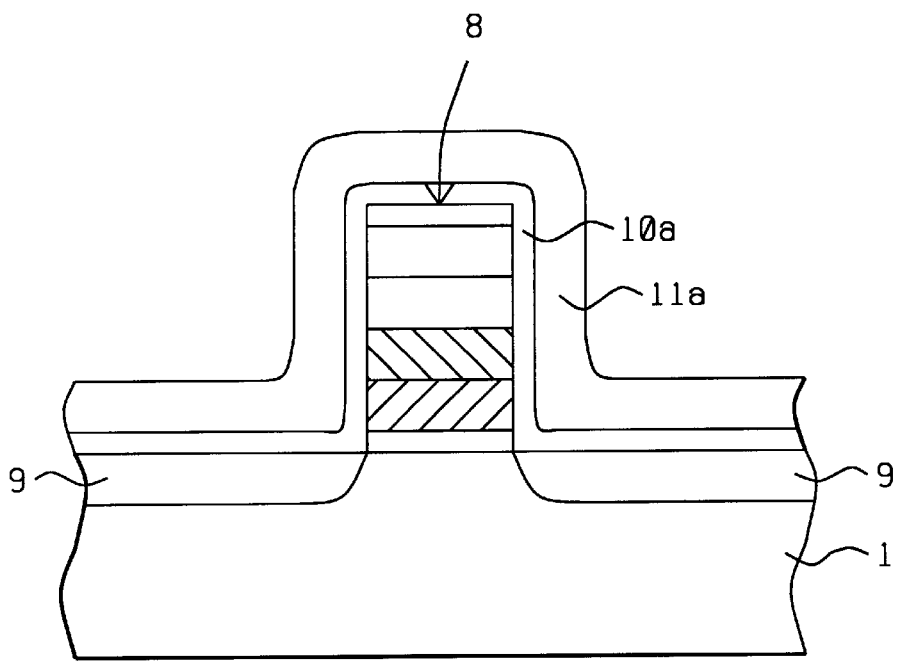

The method of forming the composite insulator spacer, featuring the oxide component needed to reduce degradation of drain current (Id), as well as transconductance (Gm), for NMOS devices, during a constant current stress, will now be described. A pre-clean procedure, using a dilute hydrofluoric (DHF), solution, is performed prior to deposition of high temperature oxide (HTO), layer 10a, which in turn is obtained via chemical vapor deposition (CVD) procedures, at a thickness between about 140 to 160 Angstroms, using $SiH_2Cl_2$ and $N_2O$ as reactants, and using a deposition temperature between about 700 to 800° C. The thickness of HTO layer 10a, to be subsequently shown and discussed in FIG. 5, is critical in optimum reduction of Id and $G_m$ degradation. After deposition of HTO layer 10a, silicon nitride layer 11a, is deposited via PECVD or LPCVD procedures, to a thickness between about 750 to 850 Angstroms. The result of these procedures is schematically shown in FIG. 3.

Figure 4:
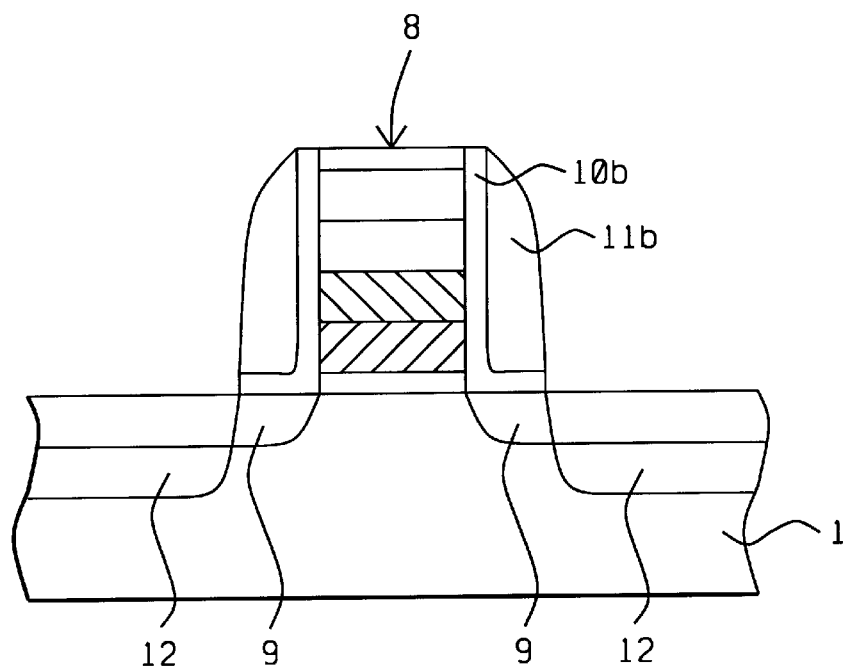

An anisotropic RIE procedure, using $CF_4$ or $CHF_3$ as an etchant for silicon nitride layer 11a, and for HTO layer 10a, is employed to define the composite insulator spacer, comprised of silicon nitride component 11b, and HTO component 10b. HTO component 10b, interfaces insulator capped, gate structure 8, and also overlays LDD region 9, in a region in which LDD region 9, is located at the edge of the narrow channel region, underlying insulator capped, gate structure 8. After definition of the composite insulator spacers a post clean procedure, accomplished in a solution comprised of 1 part hydrofluoric acid and 100 parts water, for a time between 125 to 155 sec, is performed. Finally heavily doped, N type source/drain region 12, is formed in a region of semiconductor substrate 1, not covered by insulator capped, gate structure 8, or by the composite insulator spacers. The result of these procedures is schematically shown in FIG. 4. As previously mentioned photoresist block out masking is used to prevent the N type source/drain region formation in the PMOS device regions.

The significance of using an HTO layer, at a thickness between about 140 to 160 Angstroms, in reducing Id and Gm degradation, generated during a 5 sec. constant current stress is shown using a table format in FIG. 5. The maximum device degradation, (about 60%) is evident when only a silicon nitride spacer is used on the sides of a insulator capper, gate structure of an NMOS device. Next it can be seen that for a specific thickness of oxide component, the buffered oxide layer obtained using the HTO procedure offers a greater degree of reduction of device degradation than counterpart composite insulator spacers formed using a buffer oxide layer obtained using a rapid processed oxide, (RPO), layers, which are deposited at lower temperatures, such as between about 400 to 700° C. Finally it can be seen that for HTO layers used as the buffer layer of composite insulator spacer, the optimum reduction in Id and Gm degradation, (9 to 11%), occurs for an HTO layer deposited at a thickness between about 140 to 160 Angstroms, when compared to counterparts fabricated with thinner HTO layers, of about 100 Angstroms.

While this invention has been particularly shown and described with reference to, the preferred embodiments thereof, it will be understood by those skilled in the art that various changes in form and details may be made without departing from the spirit and scope of this invention.

What is claimed is:

1. A method of forming a metal oxide semiconductor field effect transistor (MOSFET), device on a semiconductor substrate, comprising the steps of forming a gate insulator layer on said semiconductor substrate;

forming an insulator capped gate structure on said gate insulator layer wherein said insulator gate capped gate structure is comprised of an overlying silicon oxynitride layer on a silicon nitride layer, and wherein the silicon oxynitride layer is obtained via an anneal procedure performed in an oxygen ambient after formation of the silicon nitride layer;

forming a lightly doped source/drain region in an area of said semiconductor substrate not covered by said insulator capped gate structure;

forming a composite insulator spacer on the sides of said insulator capped gate structure; and forming a heavily doped source/drain region ion an area of said semiconductor substrate not covered by said insulator capped gate structure, or by said composite insulator spacer.

2. The method of claim 1, wherein said MOSFET device is an N channel, metal oxide semiconductor (NMOS), device.

3. The method of claim 1, wherein said gate insulator layer is a silicon dioxide layer, obtained via thermal oxidation procedures at a thickness between about 50 to 100 Angstroms.

4. The method of claim 1, wherein insulator capped gate structure is an insulator capped polycide gate structure, with the polycide structure formed from: an underlying polysilicon layer, obtained via LPCVD procedures at a thickness between about 1000 to 1200 Angstroms and either doped in situ during deposition via the addition of arsine or phosphine to a silane ambient, or deposited intrinsically then doped via implantation of arsenic or phosphorous ions, and formed from an overlying tungsten silicide layer, obtained via LPCVD procedures at a thickness between about 900 to 1100 Angstroms.

5. The method of claim 1, wherein said insulator capped gate structure is capped with an underlying, silicon oxide layer, obtained via PECVD procedures at a thickness between about 900 to 1100 Angstroms, and capped with said silicon nitride, obtained via LPCVD or PECVD procedures, at a thickness between about 750 to 850 Angstroms.

6. The method of claim 1, wherein an anneal procedure, performed to said insulator capped gate structure, is carried out in an oxygen ambient, at a temperature between about 800 to 1000° C., forming a said silicon oxynitride layer at a thickness between about 60 to 80 Angstroms on a said silicon nitride layer which in turn is used as an overlying insulator layer component of said insulator capped structure.

7. The method of claim 1, wherein said composite insulator spacer is comprised of an overlying silicon nitride layer and an underlying high temperature oxide (HTO) layer.

8. The method of claim 1, wherein an underlying high temperature HTO layer of said composite insulator spacer, is a silicon oxide layer at a thickness between about 140 to 160 Angstroms, obtained via chemical vapor deposition (CVD) procedures, at a temperature between about 700 to 800° C., using $SiH_2Cl_2$ and $N_2O$ as reactants.

9. The method of claim 1, wherein said a silicon nitride layer of said composite insulator spacer, is obtained via LPCVD or PECVD procedures at a thickness between about 750 to 850 Angstroms.

10. The method of claim 1, wherein said composite insulator spacer is formed via an anisotropic reactive ion etching procedure, using $CHF_3$ or $CF_4$ as an etchant for a silicon nitride and for a high temperature oxide (HTO) layer.

11. The method of claim 1, wherein said post spacer definition clean is performed in a solution comprised of 1 part hydrofluoric acid, and 100 parts water, for a time between about 125 to 155 sec.

12. A method of forming an NMOS device, for a static random access memory (SRAM), cell, on a semiconductor substrate, featuring a composite insulator spacer on the sides of an insulator capped polycide gate structure, with said composite insulator spacer comprised with an underlying, high temperature oxide (HTO), layer, comprising the steps of:

forming a silicon dioxide gate insulator layer on said semiconductor substrate;

depositing a polysilicon layer;

depositing a tungsten silicide layer;

depositing a silicon oxide layer;

depositing a first silicon nitride layer;

performing an anneal procedure, forming a silicon oxynitride layer on said first silicon nitride layer;

performing a first anisotropic, reactive ion etching (RIE), procedure to define said insulator capped polycide gate structure, on said silicon dioxide gate insulator layer, with said insulator capped polycide gate structure comprised of said silicon oxynitride layer, said first silicon nitride layer, said silicon oxide layer, said tungsten silicide layer, and said polysilicon layer;

forming an N type, lightly doped source/drain region in an area of said semiconductor substrate not covered by said insulator capped polycide gate structure;

depositing said HTO layer at a thickness between about 140 to 160 Angstroms, depositing a second silicon nitride layer;

performing a second anisotropic RLE procedure to form said composite insulator spacers on the sides of said insulator capped polycide gate structure, with said composite insulator spacers comprised of said second silicon nitride layer, and underlying said HTO layer;

performing a post spacer definition clean, in a dilute hydrofluoric acid solution; and forming a heavily doped, N type source/drain region in an area of said semiconductor substrate not covered by said insulator capped polycide gate structure or by said composite insulator spacers.

13. The method of claim 12, wherein said silicon dioxide gate insulator layer is obtained via thermal oxidation procedures at a thickness between about 50 to 100 Angstroms.

14. The method of claim 12, wherein said polysilicon layer is obtained via LPCVD procedures at a thickness between about 1000 to 1200 Angstroms and either doped in situ during deposition via the addition of arsine or phosphine to a silane ambient, or deposited intrinsically then doped via implantation of arsenic or phosphorous ions.

15. The method of claim 12, wherein said tungsten suicide layer is obtained via LPCVD procedures at a thickness between about 900 to 1100 Angstroms, using silane and tungsten hexafluoride as reactants.

16. The method of claim 12, wherein said silicon oxide layer is obtained via LPCVD or PECVD procedures at a thickness between about 900 to 1100 Angstroms.

17. The method of claim 12, wherein said first silicon nitride is obtained via LPCVD or PECVD procedures, at a thickness between about 750 to 850 Angstroms.

18. The method of claim 12, wherein said silicon oxynitride layer is formed at a thickness between about 60 to 80 Angstroms, via said anneal procedure performed in an oxygen ambient, at a temperature between about 800 to 1000° C.

19. The method of claim 12, wherein said insulator capped polycide gate structure is defined via said first anisotropic RIE procedure, using $CHF_3$ or $CF_4$ as an etchant for said silicon oxynitride layer, for said first silicon nitride layer, and for said silicon oxide layer, and using $Cl_2$ or $SF_6$ as an etchant for said tungsten silicide layer and for said polysilicon layer.

20. The method of claim 12, wherein said HTO layer, at a thickness between about 140 to 160 Angstroms, is a silicon oxide layer obtained via chemical vapor deposition (CVD} procedures, at a temperature between about 700 to 800° C., using $SiH_2Cl_2$ and $N_2O$ as reactants.

21. The method of claim 12, wherein said second silicon nitride layer is obtained via LPCVD or PECVD procedures at a thickness between about 750 to 850 Angstroms.

22. The method of claim 12, wherein said composite insulator spacers are formed via aid second anisotropic RkE procedure, using $CHF_3$ or $CF_4$ as an etchant for said second silicon nitride and for said HTO layer.

23. The method of claim 12, wherein said post spacer definition clean is performed in said dilute hydrofluoric acid solution for a time between about 125 to 155 sec, with said dilute hydrofluoric acid solution comprised of 1 part hydrofluoric acid, and 100 parts water.

* * * * *